(12) United States Patent
Subhash et al.

(10) Patent No.: US 7,538,612 B2
(45) Date of Patent: May 26, 2009

(54) CONTROL CIRCUIT FOR DIODE BASED RF CIRCUITS

(75) Inventors: Chandra Bera Subhash, Gujarat (IN); Subramanian Bharadwaj Praveen, Gujarat (IN); Singh Rajvir, Gujarat (IN)

(73) Assignee: Indian Space Research Organisation, Karnataka (IN)

( * ) Notice: Subject to any disclaimer, the term of this patent is extended or adjusted under 35 U.S.C. 154(b) by 110 days.

(21) Appl. No.: 10/567,342

(22) PCT Filed: Aug. 4, 2003

(86) PCT No.: PCT/IN03/00265

§ 371 (c)(1),
(2), (4) Date: Oct. 6, 2006

(87) PCT Pub. No.: WO2005/013029

PCT Pub. Date: Feb. 10, 2005

(65) Prior Publication Data

US 2007/0273354 A1 Nov. 29, 2007

(51) Int. Cl.
H03G 3/10 (2006.01)
(52) U.S. Cl. .................. 330/254; 330/282; 327/306; 327/310
(58) Field of Classification Search .......... 323/354; 330/254, 282, 284; 327/306, 310
See application file for complete search history.

(56) References Cited

U.S. PATENT DOCUMENTS

| | | | |
|---|---|---|---|
| 3,403,324 A * | 9/1968 | Bradley .................. | 323/354 |
| 4,280,089 A | 7/1981 | van de Plassche et al. | |
| 4,810,949 A * | 3/1989 | Schiemenz et al. ........ | 323/354 |
| 4,888,496 A | 12/1989 | Schmitz | |
| 5,216,355 A * | 6/1993 | Terada et al. ............. | 323/354 |

(Continued)

FOREIGN PATENT DOCUMENTS

EP    0 756 375 A2    1/1997

(Continued)

OTHER PUBLICATIONS

International Search Report for PCT/IN2003/000265, Aug. 4, 2003.

(Continued)

*Primary Examiner*—Bao Q Vu
(74) *Attorney, Agent, or Firm*—Rader, Fishman & Grauer, PLLC

(57) ABSTRACT

A control circuit for diode based RF circuit (6) comprising at least one analog communicating device (2, 3) having a plurality of digital control lines (A0, A1, A2, En1, B0, B1, B2, En2), a plurality of selectable poles (X0-X15) and at one common pole (Y1, Y2), the digital control lines being connected to a digital data generator (4) and the selectable poles and at least one common pole being connected to the control terminal(s) of the diode(s) of the RF circuit through a network of resistors (7-21) of differing values and a potential divider (22) and a power supply or voltage source (25) or a network of potential dividers of differing outputs and a power supply or voltage source, the analog communicating device establishing an internal coupling between the common pole and one of the selectable poles depending upon the digital value generated by the digital data generator and appearing at the digital control.

10 Claims, 3 Drawing Sheets

U.S. PATENT DOCUMENTS 5,285,169 A      2/1994  Theus
5,365,195 A *  11/1994  Kageyama .................. 330/284
5,523,712 A *   6/1996  Miyabe et al. .............. 327/355
5,877,612 A *   3/1999  Straw ......................... 330/254
6,127,893 A *  10/2000  Llewellyn et al. ........... 330/284
6,806,771 B1 * 10/2004  Hildebrant et al. .......... 330/284

FOREIGN PATENT DOCUMENTS

EP          0 928 063 A2    7/1999

OTHER PUBLICATIONS

International Preliminary Examination Report, Aug. 4, 2003.

* cited by examiner ical parameters of the RF circuits such as attenuator, phase

CONTROL CIRCUIT FOR DIODE BASED RF CIRCUITS

FIELD OF THE INVENTION

This invention relates to a control circuit for diode based RF circuits.

Electrical parameters such as attenuation, phase shift or gain of diode based RF circuits such as attenuator, phase shifter, gain control amplifier or lineariser is dependent on the RF resistance of the diode(s) thereof. The RF resistance of the diode varies with change in diode temperature thereby causing a change in the electrical parameters of the RF circuits which is undesirable. Therefore, the changes in the electrical parameters are required to be controlled for the smooth functioning of the RF circuits. The electrical parameters of the RF circuits can be controlling by controlling the RF resistance of the diode(s) which in turn can be controlled by controlling the direct current flowing through the diode(s).

PRIOR ART

Digital control circuits are used in diode based RF circuits to minimize the effect of temperature of the diode(s) thereof on the electrical parameter by controlling the direct current flowing through the diode(s).

Digital control circuits comprise temperature sensors or temperature sensitive elements connected to an ADC (analog to digital converter), a PROM (programmable read only memory) or microprocessor connected to the ADC and a DAC (digital to analog controller) connected to the PROM or microprocessor. The output of the DAC is connected to the control terminal(s) of the diode(s) of the RF circuit. The temperature sensors are placed in the proximity of the diode (s). The PROM contains data relating to electrical parameter variations at different temperatures. The temperature sensor senses the temperature of the diode(s) and outputs a signal to the PROM which is a function of the temperature sensed by it. The PROM compares this signal with the data stored therein and outputs a signal which modifies the current flowing through the diode so as to maintain the desired value of the electrical parameter irrespective of temperature variations in the diode(s). These circuits, however, require large number of components and are complex in construction and very expensive. Because the temperature sensors are disposed only in the proximity of the diode(s) the actual temperature variations are not invariably sensed by the sensors. This is more so when the RF circuits are used at high RF energy levels and the junctions of the diode(s) are heated up. This may result in improper control of the current through the diode(s) and the electrical parameter of the RF circuit. Besides when there is a gradual Change in the temperature of tile diode(s) the input to the ADC passes through a bit transition threshold resulting in abrupt changes in the output of the ADC. This may lead to cyclic oscillations between two outputs states of the ADC because of low level circuit noise and power supply ripple giving rise to improper control of the electrical parameter of the RF circuit.

Analog control circuits are also used in diode based RF circuits to minimize the effect of temperature of the diode(s) thereof on the electrical parameters by controlling the direct current flowing through the diode(s). Analog control circuits comprise adjustable non-linear circuits to achieve the desired biasing point for each value of the electrical parameter to be controlled. In addition a temperature sensitive element may be used to alter the scaling and offset of the circuit to compensate for temperature variations. These circuits however are capable of generating only a specific type of transfer function and/or a specific type of temperature compensation function and therefore cannot be used for different applications. Moreover, analog circuits are time consuming and difficult to calibrate over a wide temperature range.

OBJECTS OF INVENTION

An object of the invention is to provide a control circuit for diode based RF circuits whose electrical parameters can be accurately controlled irrespective of temperature variations in the diode(s) thereof.

Another object of the invention is to provide a control circuit for diode based RF circuits whose electrical parameters can be accurately controlled irrespective of temperature variations in the diode(s) thereof due to self heating of the junctions of the diode(s) resulting from use of the RF circuits at high RF energy levels.

Another object of the invention is to provide a control circuit for diode based RF circuits which eliminates the use of temperature sensors thereby eliminating errors due to temperature gradients.

Another object of the invention is to provide a control circuit for diode based RF circuits which is compact and economical.

Another object of the invention is to provide a control circuit for diode based RF circuits which is simple in construction and easy to operate.

DESCRIPTION OF INVENTION

According to the invention there is provided a control circuit for diode based RF circuit comprising at least one analog commutating device having a plurality of digital control lines, a plurality of selectable poles and at least one common pole, the digital control lines being connected to a digital data generator and the selectable poles and common pole being connected to the control terminal(s) of the diode(s) of the RF circuit through a network of resistors of differing values and a potential divider and a power supply or voltage source or a network of potential dividers of differing outputs and a power supply or voltage source, the analog commutating device establishing an internal coupling between the common pole and one of the selectable poles depending upon the digital value generated by the digital data generator and appearing at the digital control lines.

According to an embodiment of the invention there is provided a control circuit comprising two analog commutating devices connected in tandem, the digital control lines of the two analog commutating devices being connected to the digital data generator, each of the selectable poles of the two analog commutating devices except one being connected to the control terminal(s) of the diode(s) of the RF circuit through a resistor the resistors being of differing values and the common pole of the two analog commutating devices being connected to the output of a potential divider comprising a pair of resistors of differing values connected in series, one of the resistors being connected to the power supply or voltage source and the other being earthed.

According to another embodiment of the invention, there is provided a control circuit comprising two analog commutating devices connected in tandem, the digital control lines of the two analog commutating devices being connected to the digital data generator, the selectable poles of the two analog commutating devices except one being connected to the outputs of a network of potential dividers each comprising a pair of resistors of differing values connected in series, one of the resistors being connected to the power supply or voltage source and the other being earthed and the common pole of the two analog commutating devices being connected to the control terminal(s) of the diode(s) of the RF circuit.

According to an embodiment of the invention the digital data generator is a four bit data generator.

According to an embodiment of the invention each analog commutating device is an analog multiplexer.

According to an embodiment of the invention, the analog multiplexer comprises four digital control lines and eight selectable poles.

The following is a detailed description of the invention with reference to the accompanying drawings in which:

BRIEF DESCRIPTION OF THE ACCOMPANYING DRAWINGS

Figure 1:
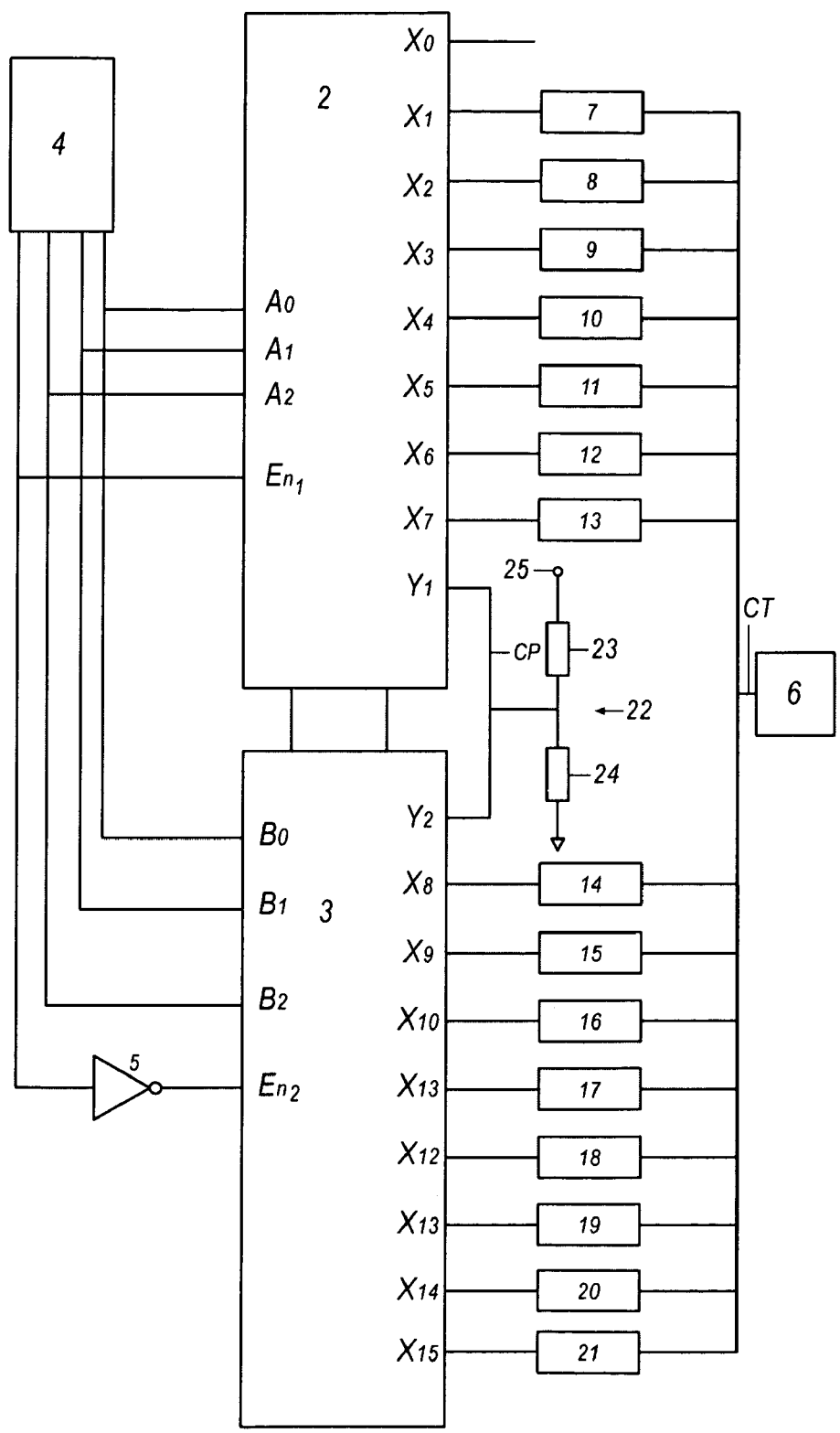
FIG. 1 is a circuit diagram of a control circuit for a diode based RF circuits according to an embodiment of the invention.

Referring to FIG. 1 of the accompanying drawings, IP is a control circuit comprising two analog multiplexers 2 and 3 connected in tandem. The digital control lines A0, A1, A2 and En1 of the multiplexer 2 and B0, B1 and B2 of the multiplexer 3 are connected to a four bit digital data generator 4. The control line En2 of the multiplexer 3 is connected to the data generator through a NOT gate 5. The selectable poles of the multiplexers 2 and 3 are marked X0 to X15. The poles Y1 and Y2 of the multiplexers 2 and 3 respectively are joined together forming a common pole CP. The selectable pole X0 of the multiplexer 2 is left unconnected.

The selectable pole X1 of the multiplexer 2 is connected to a control terminal CT of the diode(s) (not shown) of a RF circuit 6 through a resistor 7. Similarly, each of the remaining selectable poles X2 to X15 of the multiplexers 2 and 3 is connected to the control terminal CT of the RF circuit through resistors 8 to 21 respectively, 22 is a potential divider comprising a pair of resistors 23 and 24 connected in series. The common pole CP is connected to the output of the potential divider. Resistor 23 is connected to a power supply 25 and resistor 24 is earthed. The digital values at the control lines En1 and En2 of the two multiplexers control the connectivity between the selectable poles and the common pole CP. The four bit data generator 4 generates sixteen different four bit digital values from 0000 to 1111. Each of these digital values are mapped or translated into a desired value of the electrical parameter such as attenuation, phase shift or gain of the RF circuit with respect to the resistors 7-21 of differing values in known manner. For example, if attenuation is the electrical parameter of the RF circuit containing at least one PIN diode to be controlled then one of the digital values 0001 is mapped or translated to a value of attenuation say 2 dB and so on. Thus sixteen desired values of attenuation corresponding to sixteen digital values of the data generator may be obtained i.e. sixteen different commutation states are obtained. The desired values of the electrical parameter may have a well defined but non-linear progressions such as 1.13. 2.5 or arbitrary progression that is not based on any specific mathematical function such as 1, 2, 5. Depending upon the digital value outputted by the data generator, one of the selectable poles X0 to X15 of the multiplexers 2 and 3 gets selected and a DC coupling path is established from the common pole CP connected to the output of the potential divider to the selected pole which is connected to the control terminal CT of the diode(s) of the RF circuit 6 through a corresponding resistor and a current flows through this established coupling path into the RF circuit. The value of the current flowing into the diode(s) of the RF circuit through the established coupling path is such that actual value of the electrical parameter of the RF circuit is comparable to the desired value of the electrical parameter irrespective of temperature variations in the diode(s) of the RF circuit. For example, if the desired value of the electrical parameter say attenuation is 2 dB, one of the sixteen digital values generated by the data generator, say the digital value 0001 is mapped or translated to the desired value of 2 dB. When the data generator outputs the digital value 0001, the selectable pole X1 of the multiplexer 2 is selected and a DC coupling path is established from the common pole CP connected to the output of the potential divider 22 to the selectable pole X1 which is connected to the control terminal of the diode(s) of the RF circuit through the resistor 7 and thereby enabling a current to flow into the RF circuit via the DC coupling path. The value of the current is such that the actual value of attenuation of the RF circuit is comparable to the desired value 2 dB irrespective of the temperature variations in the diode(s) of the RF circuit.

Figure 2:
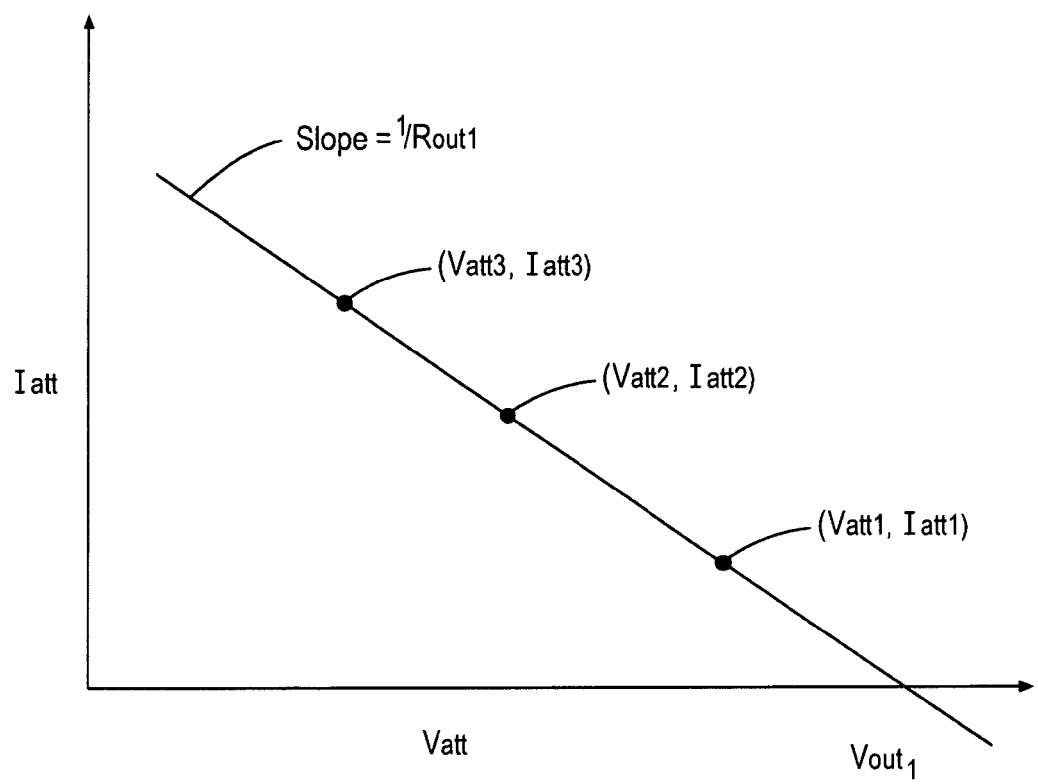
FIG. 2 is a graphical plot representing the output voltage and output resistance of the control circuit of FIG. 1.

As an illustration of a typical example the resistances R7 to R21, R22 and R23 of resistors 7 to 21, 23 and 24 which will appear in the respective DC coupling path may be determined as follows:

The RF circuit connected to the control circuit is an attenuator containing at least one PIN diode and the electrical parameter of the attenuator which is to be controlled by the control circuit is attenuation over a temperature range of $-10°$ C. to $+50°$ C. The desired values of attenuation are 0 dB to 30 dB in increments of 2 dB i.e. 0 dB, 2 dB, ... 28 dB and 30 dB. The data generator is a four bit data generator generating sixteen different four bit digital values from 0000 to 1111. Each of these sixteen digital values is mapped into a desired value of attenuation. For instance the digital value 0000 is mapped to the desired value of 0 dB and the last digital value 1111 is mapped to the desired value of 30 dB. When the data generator outputs a digital value 0000 the selectable pole X0 is selected and a coupling path is established from CP connected to the output of the potential divider 22 to X0 but since X0 is left unconnected no current flows into the attenuator and the value of attenuation of the attenuator will be 0 dB. When the data generator outputs a digital value 0001 the selectable pole X1 is selected and a DC coupling path is established from CP connected to the output of the potential divider 22 to X1 which is connected to the control terminal of the attenuator through the resistor 7 and a current flows through this path into the attenuator. The value of the current flowing through this path is such that the actual value of the atttenuation of the attenuator is comparable to the desired value of attenuation i.e. 2 dB at all temperatures from $-10°$ C. to $+50°$ C. The value of the current flowing into the attenuator is a function of the power supply 25, value of resistors 23 and 24 and resistor 7 appearing in the coupling path, the temperature of the diode(s) and electrical property of the attenuator i.e. RF resistance. To maintain the actual attenuation value close to the desired value of 2 dB, the resistors 7, 23 and 24 appearing in the DC coupling path is very important. The values of these resistors and of the remaining resistors 8 to 21 are calculated with the help of the output voltage and output resistance values of the control circuit for each of the desired values of attenuation which are in turn obtained by the calibration procedure hereinbelow:

The attenuator is connected to a network analyzer which feeds a RF signal to the attenuator and measures the attenuation offered by the attenuator to the RF signal. The attenuator is placed in a temperature controlled chamber whose temperature is varied from −10° C. to +50° C. A programmable voltage source is programmed to feed varying voltages to the attenuator. A DMM (digital multimeter) is programmed to measure the current and voltage appearing at the control terminal of the attenuator. The desired values of attenuation are 0 dB to 30 dB with increments of 2 dB i.e. 0 dB, 2 dB, 4 dB, 8 dB and finally 30 dB. The first desired value of attenuation is 2 dB. The network analyzer feeds the RF signal to the attenuator and the temperature of the chamber is maintained at −10° C. The programmable voltage source feeds the varying voltage to the control terminal of the attenuator. Simultaneously the network analyzer monitors the output of the attenuator. When the network analyzer indicates an attenuation value of 2 dB i.e. the RF signal is attenuated by 2 dB which is the first desired value of attenuation, the DMM measures the current Iatt and voltage Vatt at the control terminal of the attenuator and these values are recorded. The above procedure is continued till each of the remaining desired values of attenuation i.e. 4 dB to 30 dB is registered on the network analyzer. The voltage Vatt and the current Iatt values corresponding to each desired atenuation value is measured and recorded. The temperature of the chamber is changed to 20° C. The above procedure is repeated. The voltage Vatt and current Iatt values corresponding to each desired attenuation value is measured and recorded. The temperature of the chamber is further changed to 50° C. The voltage Vatt and current Iatt values corresponding to each desired attenuation value is measured and recorded by repeating the above procedure. Each desired value of attenuation will have three pairs of corresponding current and voltage values i.e. Iatt and Vatt measured and recorded at the three different temperatures of −10° C., 20° C. and 50° C. For example 2 dB has three pairs of current and voltage values, the three pairs being (Iatt1, Vatt1) measured and recorded at −10° C., (Iatt2, Vatt2) measured and recorded at 20° C. and (Iatt3, Vatt3) measured and recorded at 50° C. These values (Iatt1, Vatt1), (Iatt2, Vatt2) and (Iatt3, Vatt3) are then plotted on a graph (FIG. 2 of the accompanying drawings). Using the least sum squares method the slope and voltage intercept of the straight line passing through the points plotted in the above graph on a best fit basis is calculated. The straight line passing through the points plotted in the above graph is the output bias line of the control circuit corresponding to 2 dB. The voltage intercept is equal to the output voltage Vout1 of the control circuit and slope is equal to tile reciprocal of the output resistance 1/Rout1 of the control circuit. Similarly output voltage Vout and output resistance Rout of the control circuit for each of the remaining desired values of attenuation i.e. 4 dB to 30 dB are calculated using the voltage and current pairs which were measured and recorded when the network analyzer registered these desired values of attenuation.

The values R23 and R24 of resistors 23 and 24 are first obtained by solving the following equations $$Vab = (\text{Constant DC Voltage}) \times R24/(R23+R24)$$

$$Rab = (R23 \times R24)/(R23+R24)$$

Vab is the value of the output voltage Vout of the control circuit which was calculated for the highest value of current Iatt that appeared at the control terminal of the attenuator during the calibration process. This selection tends to minimize errors because a high value of current corresponds to high sensitivity to error in Vout.

Rab is any value which is less than the smallest value of Rout which was calculated for each of the desired values of attenuation. The values of each of the resistors 7 to 21 may be calculated as under:

For example $R7 = (Vab - Vattv)/Iattv - Rab$ where Vattv and Iattv are the averages of the corresponding voltage and current values measured and recorded at the control terminal of the attenuator when the network analyzer registered the desired attenuation value of 2 dB at the different temperatures of −10° C., 20° C. and 50° C. Vattv is the average of Vatt1, Vatt2 and Vatt3 and Iattv is the average of Iatt1, Iatt2 and Iatt3. Similarly the resistance and values of resistors 8 to 21 are calculated.

The control circuit will have an output bias line characterized by a calibrated slope I/Rout and a calibrated voltage intercept Vout for each of the desired values of attenuation i.e. 0 dB to 30 dB. For example if the output bias line seen in the graph (FIG. 2) corresponds to the desired value of 2 dB, the output bias line is obtained by drawing a straight line passing through points (Vatt1, Iatt1), (Vatt2, Iatt2) and (Vatt3, Iatt3) on a best fit basis. (Vatt1, Iatt1), (Vatt2, Iatt2) and (Vatt3, Iatt3) are the values of voltage and current which appeared at the control terminal of the attenuator during the calibration procedure. The voltage intercept Vout1 and slope 1/Rout1 were calculated by using least sum squares method. The values of the resistors 7, 23 and 24 appearing in the coupling path were calculated using the calibrated values Vout1, Rout1 and (Vatt1, Iatt1), (Vatt2, Iatt2) and (Vatt3, Iatt3). Therefore, at any temperature from −10° C. to 50° C. the actual current and voltage Iatt and Vatt supplied to the attenuator will be constrained to line on this output bias line thereby maintaining the actual value of attenuation close to the desired value of attenuation of 2 dB.

Figure 3:
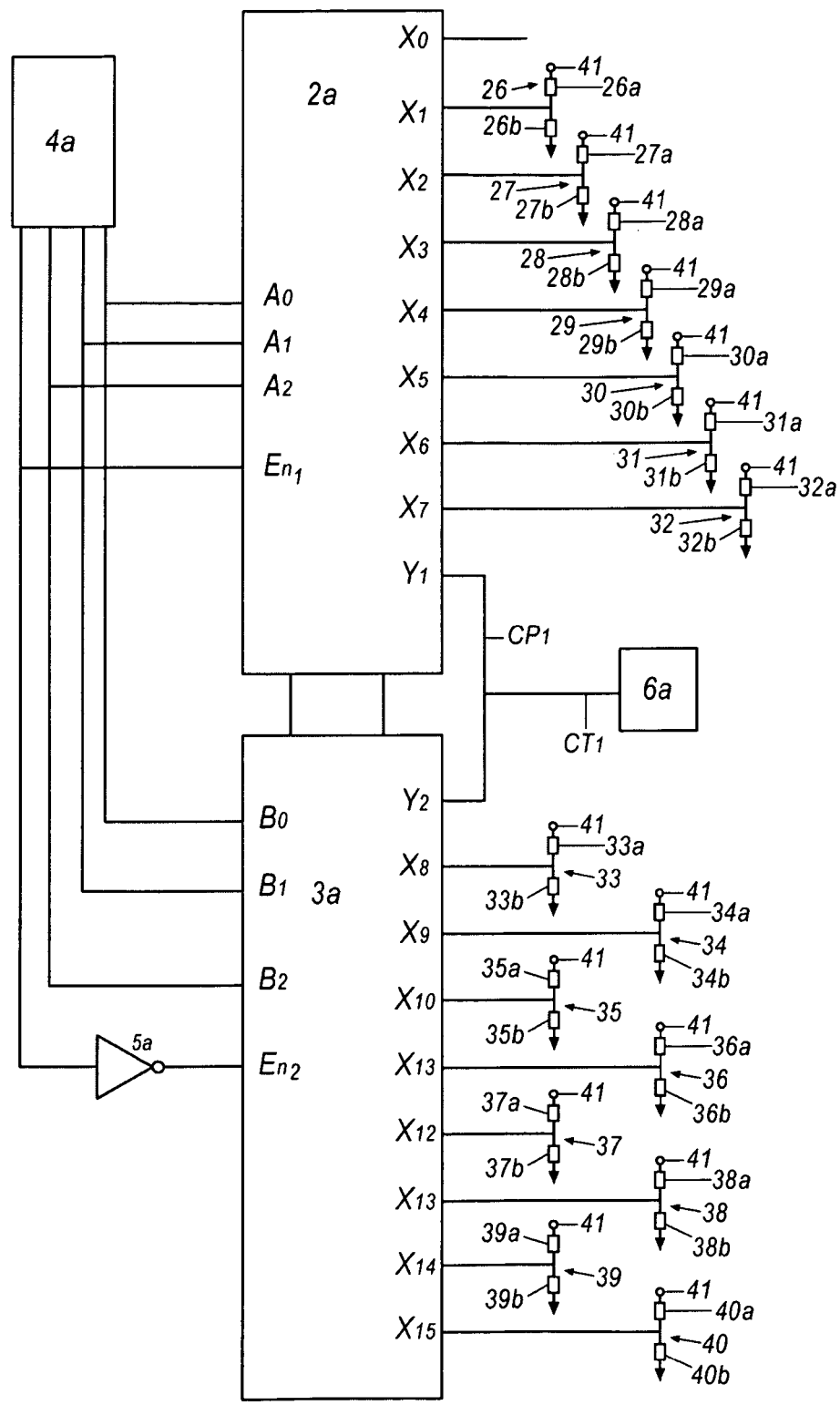
FIG. 3 is a circuit diagram of a control circuit for a diode based RF circuits according to another embodiment of the invention.

The embodiment of FIG. 3 of the accompanying drawings comprises a control circuit IQ comprising two analog multiplexers 2a and 3a connected in tandem. The digital control lines A0. A1, A2 and En1 of the multiplexer 2a and B0 and B2 of the multiplexer 3a are connected to a four bit digital data generator 4a. The control line En2 of the multiplexer 3a is connected to the data generator through a NOT gate 5a. The selectable poles of the multiplexers 2a and 3a are marked X0 to X15. The poles Y1 and Y2 of the multiplexers 2a and 3a respectively are joined together forming a common pole CPI which in turn is connected to the control terminal CTI of the diode(s) (not shown) of the RF circuit 6a. The selectable pole X0 of the multiplexer 2a is left unconnected. Each of the selectable poles X1 to X15 of the multiplexers is connected to the output of potential dividers 26 to 40, respectively. Each of the potential dividers 26 to 40 comprises a pair of resistors 26a and 26b to 40a and 40b respectively. Each of the resistors 26a to 40a is connected to a power supply 41 and each of the resistors 26b to 40b is earthed. The resistors of the potential dividers are of differing values. The digital values at the control lines En1 and En2 of the two multiplexers control the connectivity between the selectable poles and the common on pole CP1. The control circuit works in the same manner as that of FIG. 1. During operation of the control circuit one of the selectable poles X0 to X15 is selected and a DC coupling path is established from the selected pole connected to the output of a potential divider to the common pole CP1 which is connected to the control terminal CTI of the RF circuit thereby enabling a corresponding current to flow into the RF circuit via the coupling path. The value of the current flowing into the RF circuit is such that the actual value of the electrical parameter of the RF circuit is close to the desired value of the electrical parameter.

The output voltage Vout and output resistance Rout for each of the desired values of the electrical parameter is obtained by the calibration procedure described above and the values of the resistors 26a to 40a and 26b to 40b are calculated as below.

For example, If Vout1 and Rout1 are the output voltage and output resistance of the control circuit obtained for 2 dB by the calibration procedure then the values of the resistors appearing in the DC coupling path are calculated as below:

$$Vout1 = (\text{constant DC voltage}) \times R26b/(R26a+R26b)$$

$$Rout1 = R26a \times R26b)/(R26a+R26b)$$

Similarly, the values of the remaining resistors 27a to 40a and 27b to 40b are calculated.

According to the invention the control circuit controls the electrical parameter of an RF circuit accurately and reliably as the actual values of the electrical parameter of the RF circuit during operation thereof is close to the desired values of the electrical parameter. The control circuit controls the electrical parameters of the RF circuits responsive to temperature variations in the diodes of the RF circuit. Therefore, temperature variations in the diode(s) due to the self heating of the junctions of the diode(s) resulting from use of the RF circuits at high RF energy levels do not affect accuracy of the control circuit. The control circuit of the invention eliminates the use of temperature sensors thereby eliminating errors due to temperature gradients. The control circuit of the invention comprises only few components. Therefore, it is compact and economical. It is also simple in construction and easy to operate.

Depending upon the design requirements of the control circuit the digital data generator may be selected to generate more or less number of digital values as against sixteen digital values. The number of multiplexers connected in tandem may vary accordingly. There may be more than two multiplexers. The RF circuit may comprise more than one control terminal depending upon the number of diodes thereof and accordingly the number of common poles of the analog multiplexers may vary. Such variations are to be construed and understood to be within the scope of the invention.

The invention claimed is:

1. A control circuit for diode based RF circuit comprising two or more analog commutating devices connected in tandem having a plurality of digital control lines, a plurality of selectable poles and at one common pole, the digital control lines being connected to a digital data generator and the selectable poles and at least one common pole being connected to the control terminal(s) of the diode(s) of the RF circuit through a network of resistors of differing values and a potential divider and a power supply or voltage source or a network of potential dividers of differing outputs and a power supply or voltage source, the analog commutating device establishing an internal coupling between the common pole and one of the selectable poles depending upon the digital value generated by the digital data generator and appearing at the digital control lines.

2. A control circuit as claimed in claim 1, wherein each of the selectable poles of the analog commutating devices except one being connected to the control terminal(s) of the diode(s) of the RF circuit through resistors, the resistors being of differing values and the common pole of the two analog commutating devices being connected to the output of a potential divider comprising a pair of resistors of differing values connected in series, one of the resistors being connected to the power supply or voltage source and the other being earthed.

3. A control circuit as claimed in claim 1, wherein the selectable poles of the two analog commutating devices except one being connected to the outputs of the network of potential dividers each comprising a pair of resistors of differing values connected in series, one of the resistors being connected to the power supply or voltage source and the other being earthed and the common pole of the two analog commutating devices being connected to the control terminal(s) of the diode(s) of the RF circuit.

4. A control circuit as claimed in claim 1, where the digital data generator is a four bit data generator.

5. A control circuit as claimed in claim 1, wherein each analog commutating device is an analog multiplexer.

6. A control circuit as claimed in claim 5, wherein the analog multiplexer comprises four digital control lines and eight selectable poles.

7. A control circuit for diode based RF circuit comprising at least one analog commutating device having a plurality of digital control lines, a plurality of selectable poles and at one common pole, the digital control lines being connected to a digital data generator and the selectable poles and at least one common pole being connected to the control terminal(s) of the diode(s) of the RF circuit through a network of resistors of differing values and a potential divider and a power supply or voltage source or a network of potential dividers of differing outputs and a power supply or voltage source, the analog commutating device establishing an internal coupling between the common pole and one of the selectable poles depending upon the digital value generated by the digital data generator and appearing at the digital control lines, wherein each analog commutating device is an analog multiplexer and wherein the analog multiplexer comprises four digital control lines and eight selectable poles.

8. A control circuit as claimed in claim 1 comprising two analog commutating devices connected in tandem, the digital control lines of the two analog commutating devices being connected to the digital data generator, each of the selectable poles of the two analog commutating devices except one being connected to the control terminal(s) of the diode(s) of the RF circuit through a resistors, the resistors being of differing values and the common pole of the two analog commutating devices being connected to the output of a potential divider comprising a pair of resistors of differing values connected in series, one of the resistors being connected to the power supply or voltage source and the other being earthed.

9. A control circuit as claimed in claim 1 comprising two analog commutating devices connected in tandem, the digital control lines of the two analog commutating devices being connected to the digital data generator, the selectable poles of the two analog commutating devices except one being connected to the outputs of a network of potential dividers each comprising a pair of resistors of differing values connected in series, one of the resistors being connected to the power supply or voltage source and the other being earthed and the common pole of the two analog commutating devices being connected to the control terminal(s) of the diode(s) of the RF circuit.

10. A control circuit as claimed in claim 1, where the digital data generator is a four bit data generator.

* * * * *